United States Patent [19]
Bohm

[11] Patent Number: 4,699,270
[45] Date of Patent: Oct. 13, 1987

[54] MODULAR PACKAGING SYSTEM

[75] Inventor: Fred Bohm, Atlanta, Ga.

[73] Assignee: The Union Corporation, South Norwalk, Conn.

[21] Appl. No.: 774,036

[22] Filed: Sep. 9, 1985

[51] Int. Cl.⁴ ............................................. B65D 73/02
[52] U.S. Cl. .................................... 206/334; 206/328; 211/41; 312/107; 312/198; 220/22.3
[58] Field of Search ............... 206/328, 334, 504, 503; 220/23.4, 23.2, 221, 22.3; 312/107, 183, 185, 187, 198; 211/41

[56] References Cited

U.S. PATENT DOCUMENTS

| | | |
|---|---|---|
| 1,404,632 | 1/1922 | Morgan ................................ 220/22.3 |
| 3,807,572 | 4/1974 | Luvara et al. ....................... 312/107 |
| 3,829,190 | 8/1974 | Jackson .............................. 312/198 |
| 3,846,002 | 11/1974 | Floetotto ............................ 312/107 |
| 3,848,942 | 11/1974 | Fanini ................................ 312/198 |
| 3,857,619 | 12/1974 | Adickes ............................. 312/198 |
| 3,868,158 | 2/1975 | Laboue . | |
| 3,905,662 | 9/1975 | Richmond ........................... 312/198 |
| 3,915,307 | 10/1975 | Agarde .............................. 206/328 |
| 3,948,581 | 4/1976 | Helman et al. ..................... 312/107 |
| 4,099,623 | 7/1978 | Van Osdol .......................... 211/41 |
| 4,108,514 | 8/1978 | Zimmerman ....................... 312/198 |
| 4,202,586 | 5/1980 | Oplinger ............................ 312/107 |
| 4,261,464 | 4/1981 | Maitland ........................... 220/22.3 |
| 4,277,120 | 7/1981 | Drake et al. . | |
| 4,321,654 | 3/1982 | Nakajo et al. ........................ 211/41 |
| 4,328,517 | 5/1982 | Webch ................................. 211/41 |
| 4,328,897 | 5/1982 | Weiss .................................. 211/41 |
| 4,328,898 | 5/1982 | Grassi ................................. 211/41 |
| 4,407,416 | 10/1983 | Anderson ............................ 211/41 |
| 4,426,675 | 1/1984 | Robinson et al. ................... 206/328 |
| 4,433,881 | 2/1984 | Witten et al. ....................... 312/107 |
| 4,443,046 | 4/1984 | Hannah ............................. 220/22.1 |
| 4,458,813 | 7/1984 | Tushinsky et al. ................. 206/328 |
| 4,466,049 | 8/1984 | Chaney et al. ....................... 211/41 |
| 4,478,331 | 10/1984 | Ruin ................................... 206/328 |
| 4,527,222 | 7/1985 | Swingley, Jr. ..................... 206/334 |
| 4,563,722 | 1/1986 | Maroney et al. ................... 206/334 |

FOREIGN PATENT DOCUMENTS 2448880 10/1980 France ................................ 312/107

Primary Examiner—Stephen Marcus
Assistant Examiner—David T. Fidei
Attorney, Agent, or Firm—Jones, Askew & Lunsford

[57] ABSTRACT

An electronic component packaging system provides individual structural elements of modules that provide both the strength and the internal structure to mount electrical components such as circuit boards without the use of subracks. The resulting structure provides up to 15 percent more usable space for circuit boards. The modules are constructed as to be easily fixed to one another to form a multiple element modular packaging system.

3 Claims, 5 Drawing Figures

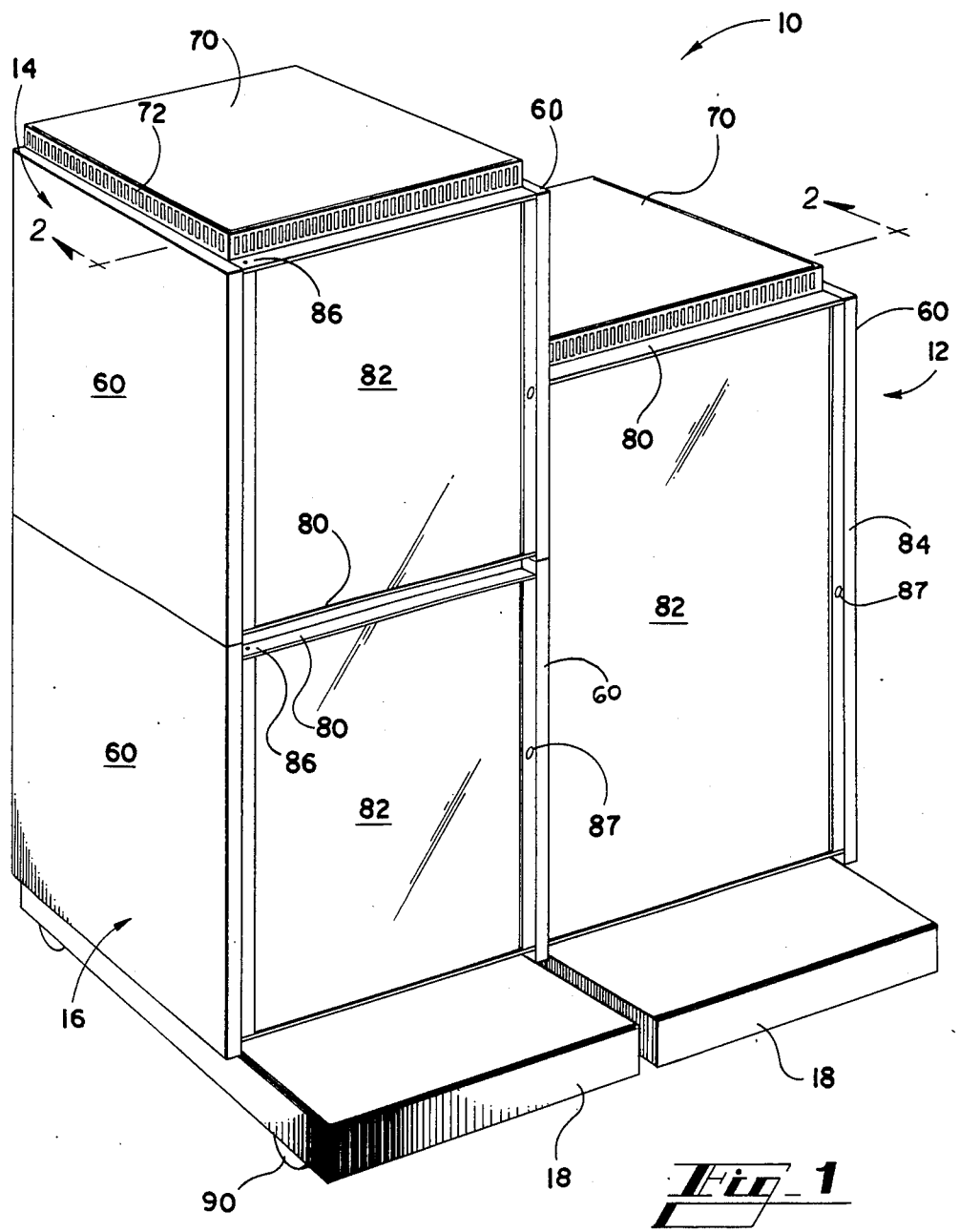
Fig_1

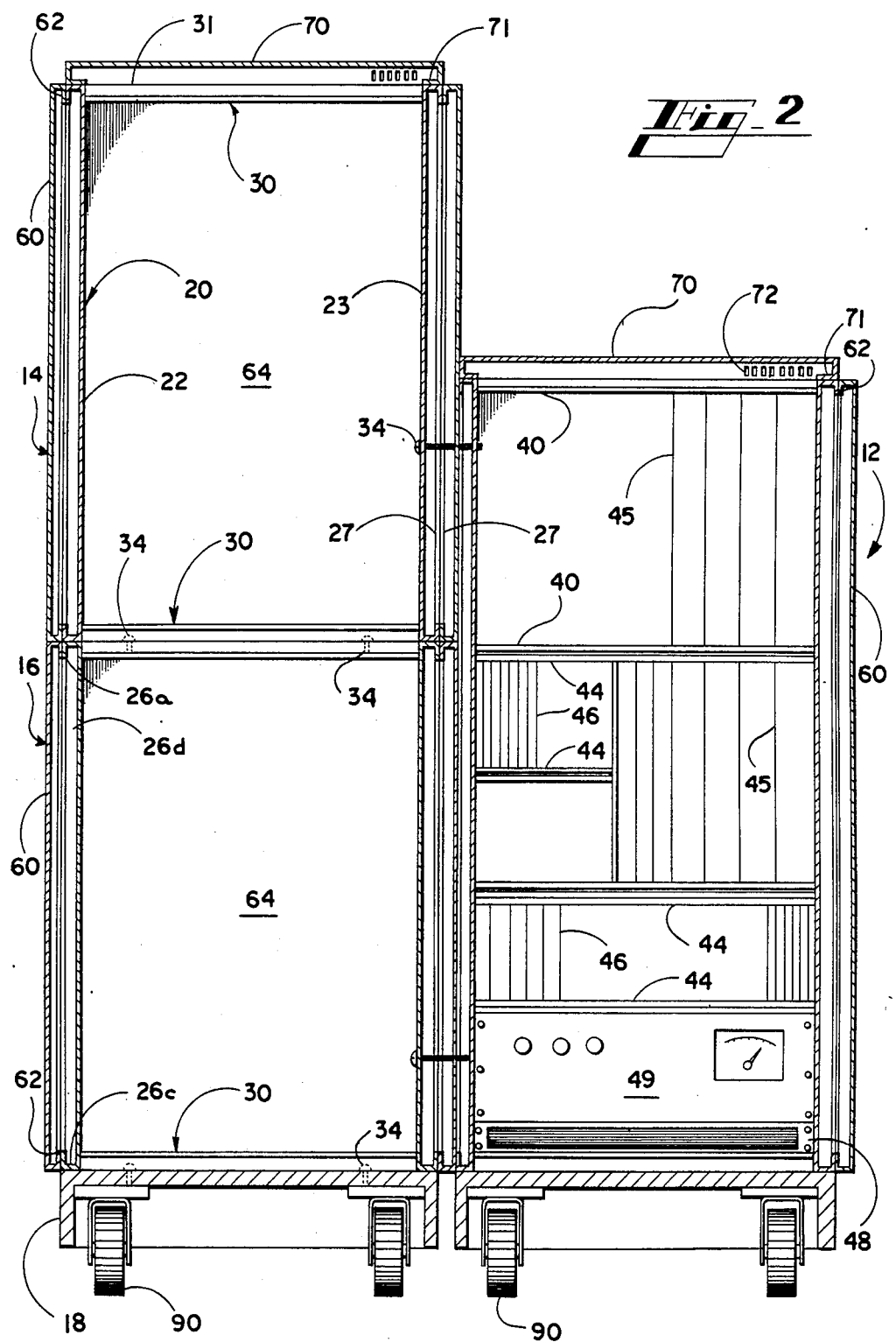

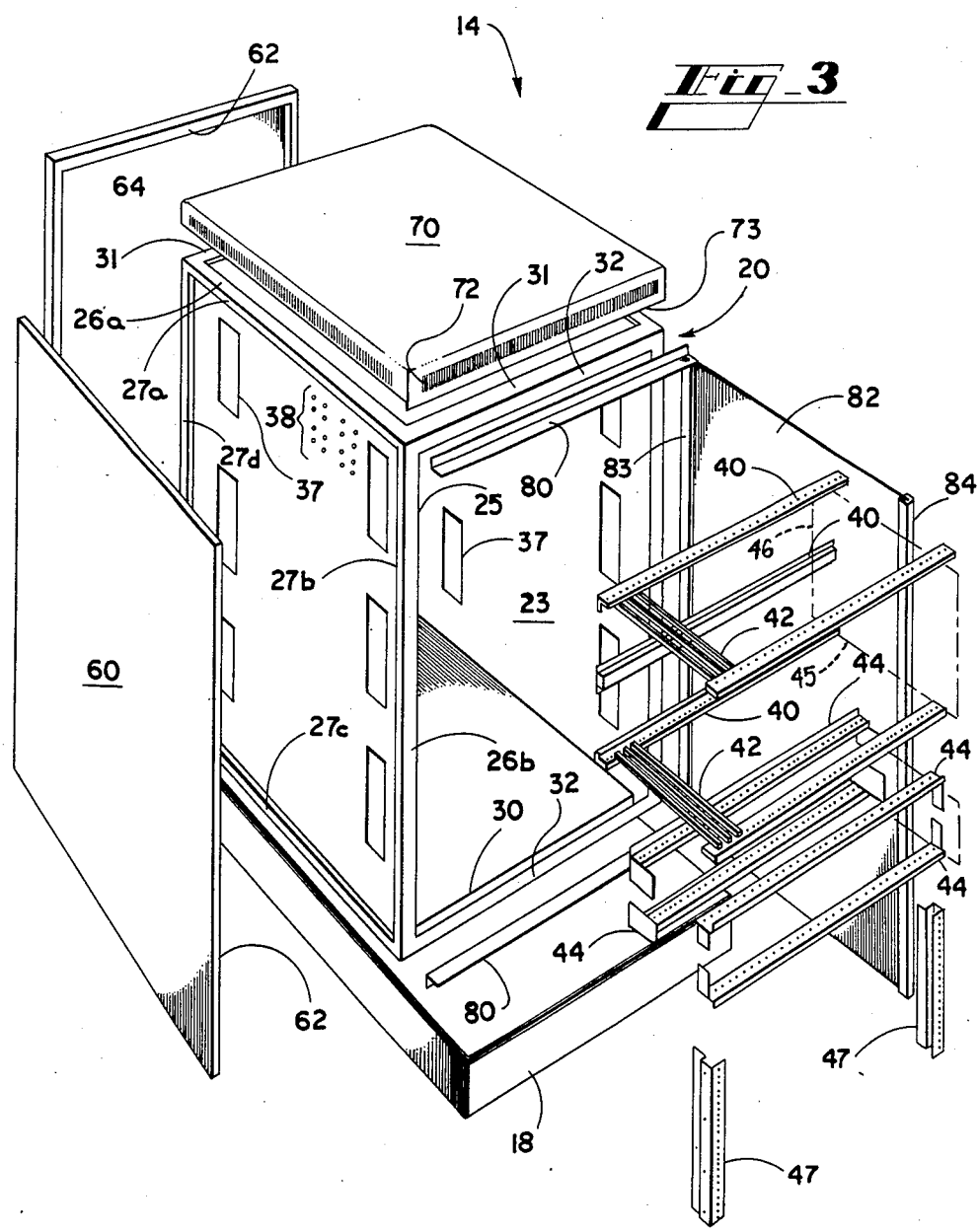
Fig_3

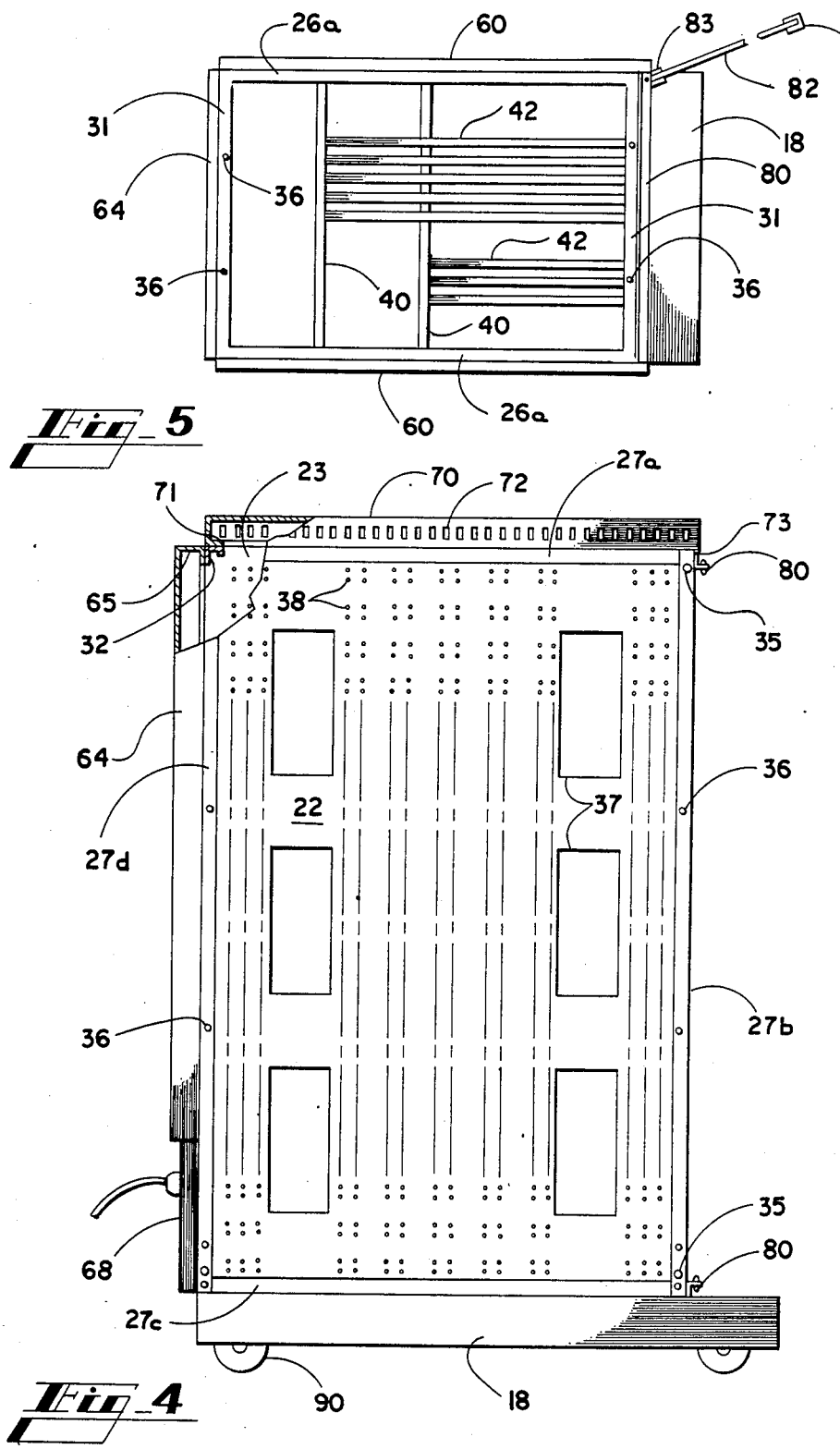

MODULAR PACKAGING SYSTEM

TECHNICAL FIELD

The present invention relates to the mounting and storage of electrical components, such as printed circuit boards and the like, and more particularly relates to a modular packaging system for such components.

BACKGROUND ART

Conventional systems for packaging electrical components have consisted of separate structures: first, a vertical cabinet including a frame and vertical mounting rails attached along the front sides of the frame; and second, subframes or subracks holding electrical components and adapted to slide within the main frame. Typically, the subframe, such as a "card cage," occupies a significant amount of space along the interior sides of the main frame, space which therefore cannot be used for the storage of the electrical components themselves. For example, a standard card cage designed to fit into a standard 19 inch vertical cabinet has only 16.8 inches of usable width for circuit boards.

One prior art frame/subframe system is shown in U.S. Pat. No. 3,868,158. A rack is provided for the mounting of connection boxes filled with printed circuit cards. More than one box can be inserted side by side in a row. Thus, valuable space is occupied by subframe sides at multiple locations between the sides of the main frame.

An adjustable card cage or cabinet for storage of cards is shown in U.S. Pat. No. 4,277,120. Circuit boards are retained between modular retaining members which allow simultaneous storage of boards having differing widths. It is stated that the cabinets are structurally arranged and have sufficient structural strength to permit stacking of multiple units for the purpose of storing unused circuit boards.

Thus, there has been a need in the art to provide a packaging device for electrical components and systems which avoids using space for non-productive subframes such as card cages, and is capable of greater versatility in mounting electrical components.

SUMMARY OF THE INVENTION

The present invention solves the problem of wasted space in electronic systems packaging by providing individual structural elements or modules that provide both the strength of a main frame and the internal structure to mount electrical components such as circuit boards without the use of subracks. The resulting structure provides up to 15 per cent more usable space for circuit boards. Furthermore, the modules are constructed to be easily fixed to one another to form a multiple element modular packaging system.

Generally described, the present invention provides a modular packaging system comprising two or more modules each including adjustable mounting means for retaining electrical components; and means for selectively connecting the modules to one another. Each of the modules preferably comprises a cuboid frame including framing members defining the edges of the cuboid, the framing members further defining an engagement surface in the plane of at least one side of the cuboid. The framing members can, for example, define engagement surfaces in the planes of the top and bottom sides of the cuboid, and the bottom engagement surface of one of the modules can be connected to the top engagement surface of the other of the modules. Panel members can then be provided enclosing exposed sides of the cuboids defined by the modules.

In the alternative, the engagement surfaces can be in the plane of a vertical side of each module, and the side engagement surfaces can be connected to one another to join the modules in side-by-side relation. When engagement surfaces are provided on the sides as well as the top and bottom of the modules, systems can be assembled including modules joined side-by-side as well as top-to-bottom.

More particularly described, the framing members of a module constructed according to the invention include a first vertical side wall, and the engagement surface faces outwardly from the first side wall and is defined by a peripheral return flange extending continuously around the edge of the first side wall. The return flange comprises a first flange member extending outwardly from the first side wall, and a second substantially flat flange member extending vertically from the first member toward the center of the first side wall. The modules are then connected by attaching adjacent second flange members to one another. The modules preferably include a second side wall positioned in spaced apart relation to the first side wall, with a similar return flange facing outwardly. Electrical components can be retained by a plurality of rails extending between the first and second side walls.

The present invention also encompasses a module for packaging electrical components, comprising first and second side walls connected in spaced apart relation, the side walls each defining an engagement surface facing outwardly from the side wall and being defined by a peripheral return flange extending continuously around the edge of the side wall, the return flange comprising a first flange member extending outwardly from the side wall, and a second substantially flat flange member extending vertically from the first member toward the center of the side wall.

Horizontal and vertical attachment of modules embodying the invention allows each user exceptional versatility. The exact amount of packaging can be assembled to fit current needs, and capacity can be expanded by adding modules, instead of having to buy the necessary number of standard vertical cabinets.

In order to accommodate existing 19 inch chassis, drawers, and the like, conventional vertical rails and slides can be attached to the frame of the modules. Thus, the packaging system of the present invention can be used without redesigning conventional components already in the possession of the user.

Thus, it is an object of the present invention to provide an improved packaging system for electrical components.

It is a further object of the present invention to provide a packaging system which utilizes for electrical components the space used in the past for subracks.

It is a further object of the present invention to provide a packaging system that can be assembled in a variety of shapes and sizes from individual modules.

It is a further object of the present invention to provide a packaging system that eliminates one level of traditional packaging.

It is a further object of the present invention to provide a packaging system that provides greater versatility of systems architecture and less handling of system components.

It is a further object of the present invention to provide a packaging system that can accommodate all types of rack-mounted components, including both inch and metric dimensions.

It is a further object of the present invention to provide a packaging system which can store the same electrical components at a reduced cost as compared to conventional packaging systems.

It is a further object of the present invention to provide a packaging system to which a user can convert easily and integrate easily with existing systems.

Other objects, features, and advantages of the invention will become apparent upon review of the following detailed description of embodiments of the invention, when taken in conjunction with the drawing and the appended claims.

BRIEF DESCRIPTION OF THE DRAWING

FIG. 1 is a pictorial view of a modular packaging system embodying the invention, consisting of three modules.

FIG. 2 is a front cross sectional view of the modular packaging system of FIG. 1, taken along line 2—2 of FIG. 1.

FIG. 3 is an exploded pictorial view of a single module embodying the present invention.

FIG. 4 is a side view of a single module with the exterior panel removed and portions broken away to show interior detail.

FIG. 5 is a top view of a single module with the top panel removed.

DETAILED DESCRIPTION

Referring now in more detail to the drawing, in which like numerals represent like parts throughout the several views, FIG. 1 shows a modular packaging system 10 embodying the present invention. The modular packaging system 10 is made up of three assembled modules 12, 14, and 16, mounted on two bases 18 and attached together in a manner described below. The module 14 rests directly on the top of the module 16, while the module 12 is attached to the sides of both the modules 14 and 16. The configuration of modules shown in FIG. 1 is only one example of a modular packaging system according to the invention. After reviewing the following detailed description, it will be understood that an unlimited number of combinations of module sizes and configurations can be assembled to meet the needs of a particular user for a modular packaging system.

As best seen in FIGS. 2 through 5, each module is cuboid in shape and similar in construction, although the height, width and depth may be changed from module to module. A rigid cuboid frame 20 is the principal structural component of the modular packaging system 10. The frame 20 includes a pair of vertical side walls 22 and 23 held in spaced apart relation by four channel members 30, which connect the side walls 22 and 23 at their corners.

Each of the side walls 22 and 23 defines a return flange 25 extending continuously around the peripheral edge of the side wall. The return flange includes a first flange member 26 extending outwardly from the side wall 22 or 23, and a second flange member 27 extending from the outer edge of the first flange member toward the center of the side wall. The first flange member 26 is made up of connected segments, a top segment 26a, front segment 26b, bottom segment 26c, and rear segment 26d. The second flange member is a square flat piece lying in a single vertical plane, and is made up of coplanar segments, a top segment 27a, front segment 27b, bottom segment 27c, and rear segment 27d. The second flange member 27 thus forms a side engagement surface for abutting the side of an adjacent module. In FIG. 2, for example, the flange member 27 of the module 12 engages exterior panels 60 (described below) which are attached to flange members 27 of both the modules 14 and 16 to act as a spacing panel. Alternately, the respective flanges 27 of the adjacent modules could be abutted directly against one another.

The channel members 30 which connect the side walls 22 and 23 of each module include a flat channel "floor" member 31 and a flat channel side member 32. Each channel floor 31 lies in either the top or bottom plane of its module, perpendicular to the plane of the side walls. Each channel side extends inwardly from the channel floor in a vertical plane. Two channel floors lie in a common plane with the top segments 26a of the first flange members 26 of the side walls, thus forming therewith a top engagement surface. The other two channel floors lie in a common plane with the bottom segments 26c of the first flange members 26 of the side walls, thus forming therewith a bototm engagement surface. A top engagement surface of the module 16 is fixed to a bottom engagement surface of the module 14 in FIG. 2.

The channel sides lie in a common plane with a front segment 26b or rear segment 26d of the first flange members 26 of the return flanges 25, forming front and rear engagement surfaces which could be used to increase the depth of the modular packaging system by joining two modules front-to-rear.

The engagement surfaces described above are preferably made smooth by machining or other appropriate process to provide a tight fit against other modules, and to receive beryllium copper gasketing if EMI/RFI shielding is desired.

Adjacent modules such as modules 12, 14 and 16 are preferably joined by bolt and nut assemblies 34 which attach engagement surfaces of respective modules in abutting relationship. To facilitate such attachment, the frame 20 of each module is provided with bolt openings 35 along the engagement surfaces, that is, along the flange members 27 of the return flanges 25 (as shown in FIG. 4), and along the channel floors 31 of the connecting channel members 30 (as shown in FIG. 5). The openings 35 can be spaced along the frame members where needed. For example, in the system of FIGS. 1 and 2 openings 35 must be provided to allow the modules 16 and 14 to be attached to the side engagement surface of the module 12.

In the case of the second flange members 27, the openings 35 preferably extend also through the side wall 22 or 23 so that the bolt 34 can be fastened from the inside of the module. Any exterior panel 60 between adjacent modules is also provided with openings for the bolts 34. Those bottom engagement surfaces which rest on the bases 18 can be bolted directly to the bases.

The flat members 27, 31 and 32 also include openings 36 used to affix decorative panels to the frame 20, as described below. Other openings in the frame include large openings 37 and smaller openings 38 in the side walls 22 and 23. When two modules are joined side-to-side, the large openings 37 are utilized to pull cables from one module to another. The smaller openings are preferably distributed over the entire surface of the side walls and are used to attach hardware for supporting electrical components.

Examples of mounting hardware are shown in FIGS. 3 and 5, and include cross rails 40 for Eurocard circuit boards 45 (shown in outline), and cross rails 44 for inch cards 46 (shown in outline). Such cross rails 40 and 44 extend between the side walls 22 and 23, and are held to the side walls by screws (not shown) extending through the side walls into the ends of the cross rails, or by bolts (not shown) extending through both the side walls and end portions of the rails. Such rails are normally placed adjacent to the front of the frame 20, and at a depth commersurate with the depth of the circuit cards in question. Fig. 5 shows rails for supporting cards of differing lengths at different heights within the frame 20. Card guides 42 extend between the front and rear rails 40 or 44, and slidably receive the circuit cards in a conventional manner.

Vertical mounting rails 47 for standard 19 inch components can also be attached to the interior of the side walls 22 and 23. The rails 47 allow such components to be inserted just as they would be into a conventional vertical cabinet. Examples of standard components mounted in a module according to the invention are a fan tray 48 and a non-circuit board component chassis 49, shown in FIG. 2. Of course, the width of the frame 20 can be varied to other standard (such as 24 inch) or non-standard dimensions. Frame heights are preferably based on multiples of standard EIA/IEC increments of 1.75 inches or 44.45 mm.

It will thus be seen that the present invention utilizes all the space between the side walls for circuit boards. In contrast, a conventional vertical cabinet would be used to load a card cage between the vertical rails 47, losing the space occupied by the rails 47 and the card cage subframe. While a module according to the invention accomplishes this efficiency, it is still versatile enough to accommodate standard 19 inch components.

Each module or series of modules assembled into a modular packaging system 10 can be efficiently covered by decorative panels. Side exterior panels 60 can be screwed or bolted onto the flat flange member 27 using the openings 36. The panels 60 include a retrn flange 62 which extends continuously around the panel 60 and fits matingly against the flange member 27 as shown best in FIG. 2. This construction avoids any exposed edges and provides attractive visual lines. Any module side that is not abutted against and attached to another module preferably is fitted with a panel 60 sized to match the dimensions of the module. Special size panels such as panel 61, shown in FIGS. 1 and 2, can be provided to cover less than a full module side. The panel 61 is constructed similarly to the panels 60, and includes a return flange 62.

A rear external panel 64 is preferably provided, having a return flange 65, shown in FIG. 4, which engages rear segments of the first flange member 26 and coplanar channel sides 32. The rear panel 64 can cover the entire rear of the frame 20, or a connector panel 68 can be provided to facilitate electrical connection between the components within the module and external components or power supplies. The connector panel 68 can be bolted directly to the return flanges 25 of the side walls.

A top exterior panel 70 encloses the top of each exposed module in the preferred embodiment of the invention. The top panel 70 preferably includes a return flange 71 extending around the sides and rear of the top panel 70. The front of the top panel is preferably even with the front side of the module, and includes an extension 73, best shown in FIG. 4. The extension 73 covers the upper front channel member for a decorative effect. For purposes of ventilation of the electrical components within the module, vent openings 72 can be provided in the top panel 70.

It is often desirable to provide a door for access to electrical components in a packaging system. A module embodying the invention can include a pair of L-shaped door mounting brackets 80 attached to the front-facing channel sides 32 of the module, and extending a short distance away from the front plane of the frame 20. For a desired visual effect, the side panels 60 can be extended by the same distance beyond the front plane of the frame 20, as shown in FIG. 5. A door panel 82, for instance a plexiglass panel, is fitted with vertical edge trim pieces 83 and 84 which are U-shaped and slidably receive the door panel 82. The edge trim piece 83 defines a pair of hinge pins 86 at its upper and lower ends. The hinge pins 86 are received in openings in the mounting brackets 80. The trim piece 84 can be fitted with a lock 87 capable of engaging the frame 20 to prevent unauthorized access to the components within the module. Each module of the modular packaging system 10 is fitted with a separate door as shown in FIG. 1. The door panel 82 can be made of aluminum if shielding is desired.

If it is desired to move the modular packaging system 10 from place to place frequently, the bases 18 can be provided with wheel or caster assemblies 90, which are of conventional construction. The bases also can be perforated or largely open for ventilation. The extension of the base beyond the front of the modules as shown in the drawings enhances the stability of the system. As an alternative to the dual base configuration shown, it will be understood that a single large base can be provided underlying more than one module.

Assembly and use of a modular packaging system 10 embodying the invention will be apparent from the foregoing. The desired individual modules, such as the modules 12, 14 and 16, are arranged in the desired configuration on the appropriate number of bases 18 (two in FIG. 1) with the appropriate engagement surfaces in abutting relationship. Bolt assemblies 34 are then used to attach the modules together and to fix the assembled modules to the base. If desired, side exterior panels 60 can be installed between the side by side modules by attaching the panels to an engagement surface of one of the modules. Appropriate hardware for mounting electrical components, such as cross rails 40,44 and vertical mounting rails 47, are attached to the side walls 22 and 23 of each of the modules to accommodate the particular user's components. The exposed sides, backs, and tops of the modules are covered by installing panels 60, 64 and 70. If a door is desired, the door mounting brackets 80 are installed prior to the top panel 70, with the hinge pins 86 of the door received in openings in the brackets 80. The extension 73 of the top panel is placed over a portion of the upper mounting bracket 80 as the top panel 70 is installed.

If changes in the configuration of components within any of the modules are desired, the internal mounting hardware can easily be changed. Exterior panels can be removed easily to facilitate such work. Furthermore, if the user desires to enlarge the modular packaging system or rearrange the configuration of existing modules, the system can easily be broken down into the module frames and reassembled as desired, as described above.

If a user needs only one module, a configuration as shown in FIGS. 3 and 4 can be utilized. Of course, additional modules can be attached to meet future needs.

From the foregoing it will be understood that a modular packaging system according to the invention provides a unique and efficient system for packaging electrical components. The advantages of the invention are derived in important part from the use of self contained modules which directly receive electrical components and can be assembled together in any desired configuration. The invention eliminates one level of conventional packaging, the card cage or subrack, resulting in a saving of the cost of the subracks themselves as well as a saving through more efficient use of the space within the primary frame. The flexibility of a system according to the invention allows the user to add additional space for components without discarding an initial smaller configuration. The ability to accept all types and sizes of circuit boards and other components, and to change the internal arrangement of such components at will, makes the present modular packaging system extremely versatile. Furthermore, the structure of the module frames and the exterior panels cooperate to enable the completed system to have a pleasing appearance.

While this invention has been described in detail with particular reference to the preferred embodiments thereof, it will be understood that variations and modifications can be made without departing from the spirit and scope of the invention as defined in the appended claims.

What is claimed is:

1. A module for packaging electrical components and performing the function of a card cage as well as a supporting frame, comprising:

first and second side walls connected in spaced apart relation, said side walls each integrally defining a structural peripheral channel including an engagement surface facing outwardly from said side wall, said peripheral channel being defined by a peripheral return flange extending continuously around the edge of said side wall, said return flange comprising a first flange member extending outwardly from said side wall, and a second substantially flat flange member extending vertically inwardly in the plane of the side wall from said first member toward the center of said side wall; and a plurality of rails connected directly to said side walls and extending therebetween for receiving card guides.

2. The module of claim 1, further comprising a plurality of card guides supported by said rails.

3. The module of claim 1, further comprising an upper engagement surface comprising coplanar upper segments of each of said first flange members and means for connecting said side walls including a flat surface in the plane of said upper segments of said first flange members.

* * * * *